United States Patent [19]

Smith et al.

[11] Patent Number: 5,119,025

[45] Date of Patent: Jun. 2, 1992

[54] HIGH-SENSITIVITY MAGNETORESISTIVE MAGNETOMETER HAVING LAMINATED FLUX COLLECTORS DEFINING AN OPEN-LOOP FLUX-CONDUCTING PATH

[75] Inventors: Neil Smith, San Diego; Frederick J. Jeffers, Escondido, both of Calif.

[73] Assignee: Eastman Kodak Company, Rochester, N.Y.

[21] Appl. No.: 737,755

[22] Filed: Jul. 30, 1991

Related U.S. Application Data

[63] Continuation-in-part of Ser. No. 558,352, Jul. 26, 1990, abandoned.

[51] Int. Cl.⁵ ............................................. G01R 33/06
[52] U.S. Cl. ................................. 324/252; 338/32 R; 324/260; 360/113
[58] Field of Search ............ 324/207.21, 207.12, 324/235, 252, 244, 260, 261, 262, 251, 207.14; 307/309; 338/32 R, 32 H; 360/113

[56] References Cited

U.S. PATENT DOCUMENTS

| | | | |
|---|---|---|---|
| 3,260,932 | 7/1966 | Weiss et al. | 324/252 |
| 3,390,330 | 6/1968 | Meyerhoff et al. | 324/252 X |
| 3,493,694 | 2/1970 | Hunt | 324/252 X |
| 4,048,557 | 9/1977 | Chen | 324/252 X |
| 4,489,357 | 12/1984 | Van Ooijen et al. | 360/113 |
| 4,679,107 | 7/1987 | Imakoshi et al. | 324/252 X |
| 4,734,644 | 3/1988 | Imakoshi et al. | 324/252 |
| 4,789,910 | 12/1988 | Otsuka et al. | 360/113 |
| 4,956,736 | 9/1990 | Smith | 324/252 X |

OTHER PUBLICATIONS

Kwiatkowski et al, "The Permalloy Magnetoresistive Sensors—Properties and Applications", *Jr. Phys. E: Sci. Instrum*, vol. 19, (no month) 1986, (Gt. Brit.), pp. 502–515.

Gebhardt et al, "A magnetoresistive Permalloy Magnetic Field Sensor", *Experimentelle Technik der Physik*, vol. 30, (no month) 1982, pp. 363–367.

*Primary Examiner*—Kenneth A. Wieder
*Assistant Examiner*—Warren S. Edmonds
*Attorney, Agent, or Firm*—Dennis P. Monteith

[57] ABSTRACT

A magnetometer includes a magnetoresistive element and first and second high-permeable laminated flux collectors of height H partially overlapping, respectively, opposing lateral edges of the magnetoresistive element, wherein the flux collectors are separated laterally by a gap of length G which the magnetoresistive element spans. The two laminated flux collector and the magnetoresistive element cooperatively form an open-loop flux-conducting path of total height 2H+G, that is capable of collecting flux of a magnetic field being measured and, in response to the flux collected, developing a magnetometive force across the gap G that is functionally related to the height of the flux collectors.

4 Claims, 3 Drawing Sheets

HIGH-SENSITIVITY MAGNETORRESISTIVE MAGNETOMETER HAVING LAMINATED FLUX COLLECTORS DEFINING AN OPEN-LOOP FLUX-CONDUCTING PATH

This is a continuation-in-part of application Ser. No. 558,352, filed July 26, 1990 in the names of N. Smith et al, now abandoned.

BACKGROUND OF THE INVENTION

1. Field of the Invention

This invention relates to a sensor for measurement of magnetic fields, and in particular to a magnetic field sensor using a magnetoresistive (MR) element and associated flux collectors.

2. Description Relative to the Prior Art

A wide variety of sensors are known in the art for use in measuring magnetic fields. Among these are the Hall effect sensor, proton resonance effect sensor, superconducting quantum interference detector (SQUID), fluxgate magnetometer, inductive pickup, magnetoresistive sensor and others. Depending upon the application, one or another of the above sensors may be chosen for a particular magnetic field measurement.

Among these sensors, the MR sensor has proven to be one of the most versatile magnetic field detectors. The single strip MR conventional element is relatively simple to fabricate, has a flat frequency response to very high frequencies, and has acceptable sensitivity, i.e. signal voltage per unit signal field, for typical field measurements. For low amplitude magnetic field measurements, however, the sensitivity of an MR sensor of such a single strip configuration is limited. Large area MR sensors have been developed where the MR element is deposited on a substrate in a meandering pattern, increasing the length of the MR element many fold compared to a conventional single strip MR. This configuration increases the total resistance of the sensor, and as the signal is proportional to the change of resistance with applied magnetic field, the sensitivity of the sensor is correspondingly improved. However, as the signal-to-noise ratio is proportional to the square root of power, power dissipation increases more rapidly than does the sensitivity with increasing resistance. Additionally, the large area sensor takes up a relatively large volume due to the increased surface occupied by the MR element, precluding the possibility of its use as a small probe for measuring the magnetic field in a localized space. Such a large area sensor is described by Kwiatkowski and Tumanski, "Journal of Physics E: Scientific Instruments", Great Britain, Volume 19, 1986, page 510.

It is known in the prior art that the sensitivity of an MR sensor may be improved by providing high permeability flux collectors in line with the MR element. The prior art teaches the use of bulk permalloy rod flux collectors with dual MR sensors such that the overall length of the sensor assembly is approximately 20 centimeters. (O. Gebhardt, W. Richter, "Experimentelle Technik der Physik", volume 30, 1982, pages 363-367.) It will be appreciated that as with the large area sensor, the dual MR sensor with bulk permalloy rod flux collectors, being 20 centimeters in length, is unsuitable as a probe for field measurement in restricted volumes.

SUMMARY OF THE INVENTION

Unlike the sensors of the prior art, the magnetic field sensor of the invention is a miniature, single strip thin film MR element, deposited on a substrate with contiguously deposited thin film flux collectors which slightly overlap the MR element. The deposited flux collectors increase the sensitivity of the sensor of the invention to equal or exceed the sensitivity of the dual strip MR sensor with flux collectors known in the prior art. The thin film sensor of the invention is capable of responding to fields of amplitude as low as $10^{-6}$ oersted with a measurement bandwidth of less than or equal to 3 Khz, and exhibits uniform response from d.c. to well above 1 Mhz. The thin film flux collectors comprise laminations of deposited high permeability magnetic material to avoid eddy current losses at the high frequencies. An even number of laminations in each flux collector is disclosed to encourage magnetic coupling between the two laminations comprising each pair, minimizing Barkhausen noise due to domain formation in the laminations.

A coil may be wound over the sensor and substrate as a means to apply either a.c. or d.c. bias, $H_b$, (FIG. 3) for linearizing the output of the sensor, or for compensation of unwanted static or low frequency interfering magnetic fields. The substrate mounted sensor and flux collectors, and the coil may be packaged in a volume smaller than 1 cubic centimeter.

The MR element of the sensor is shaped as a rhomboid, as taught in U.S. Pat. No. 4,956,763 which is herein incorporated by reference. The rhombic shape of the MR element can help prevent the formation of multiple domains in the MR element with attendant Barkhausen noise after recovery from an overload signal which may temporarily saturate the MR element.

The dimensions of the MR element and flux collectors have been chosen for approximately maximum sensitivity and for miniaturization of the sensor. The thin film deposition techniques utilized in fabrication of the sensor allow overlapping the flux collectors and the MR element, and the sizing of the thickness and gap spacing of the flux collectors so that approximately maximum sensitivity is attained in a simple, compact and economical manner.

DESCRIPTION OF THE PREFERRED EMBODIMENT

Figure 1A:
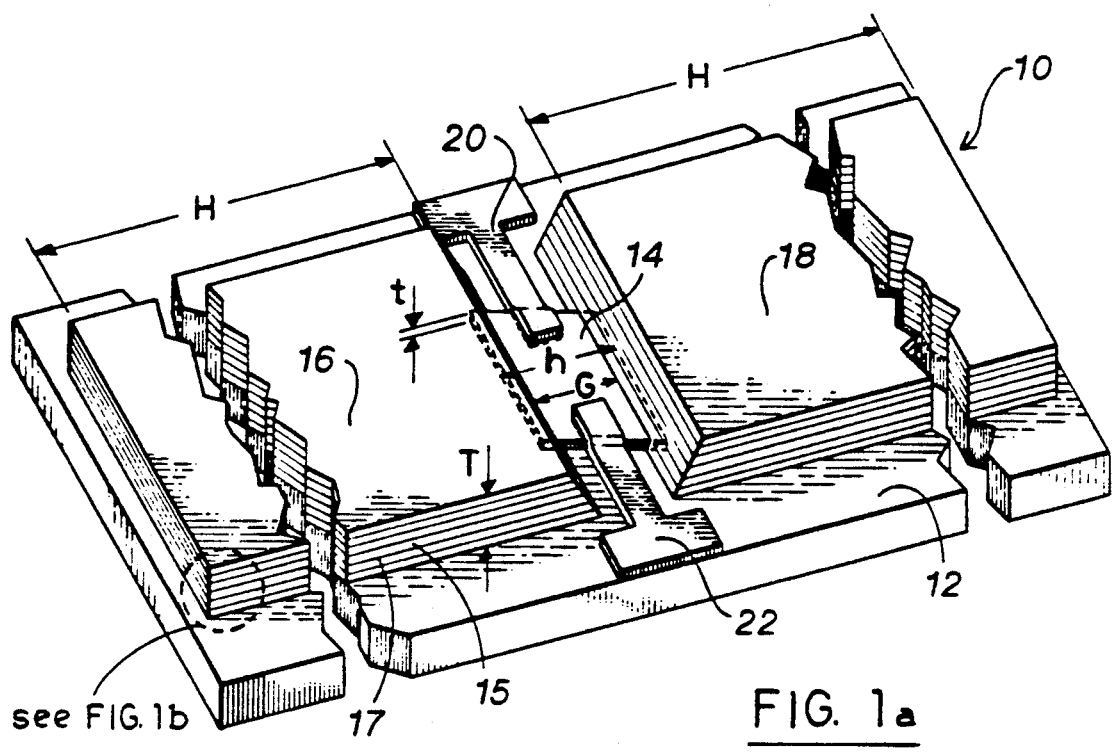
FIG. 1a is a drawing of a magnetic field sensor in accordance with the invention.
Figure 1B:
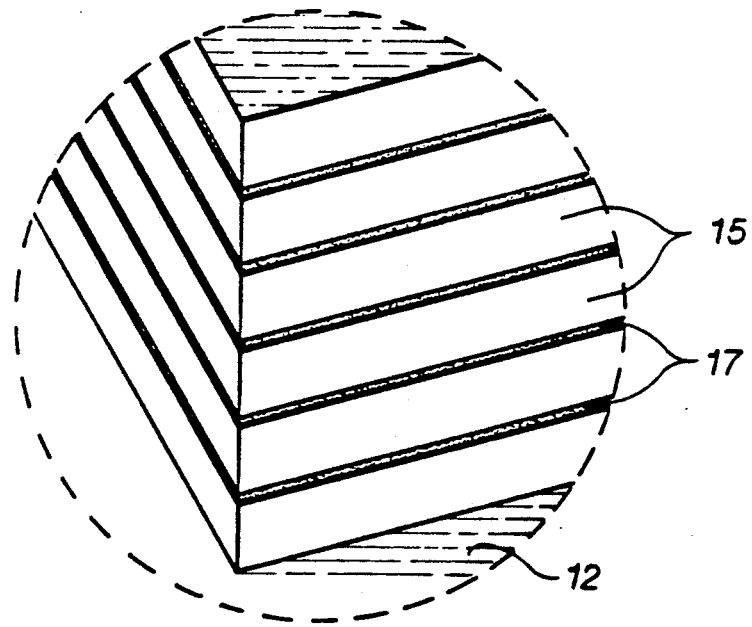
FIG. 1b is an expanded view of a laminated flux collector of the field sensor seen in FIG. 1a, FIG. 2 is a plot of the relative sensitivity of the sensor as a function of the height of each flux collector.

Referring to FIG. 1a, a preferred embodiment of a magnetic field sensor 10 comprises a substrate 12 upon which is deposited a permalloy MR element 14. The conductors 20, 22 for conducting sense current through the MR element 14 are deposited in electrical contact with the MR element 14. A thin layer of $SiO_2$ is deposited to insulate the MR element 14 from flux collectors 16, 18 which are then deposited contiguous to, and slightly overlapping the edges of the MR element 14. Each flux collector 16, 18 comprises six stacked 1-micron thick laminations 15 of highly permeable NiFe magnetic material separated by 0.1 micron layers of $SiO_2$, 17, as seen in FIG. 1a and FIG. 1b.

The voltage drop across the MR element 14 due to the flow of sense current via the conductors 20, 22 varies in accordance with the resistance change of the MR element 14 resulting from a changing magnetic field applied at the element 14 by means of the flux collectors 16, 18.

In a presently preferred embodiment, the thickness, t, of the MR element 14 is 250 angstroms, and the MR element 14 has a rhomboid shape of interior angle 30 degrees, to provide protection against domain formation as described above. The anisotropy field, $H_k$, is four oersteds, which is readily attainable using conventional magnetic material thin film deposition techniques. The magnetic permeability of the MR element 14 and the flux collectors 16, 18 is approximately 2000.

The overlap between the element 14 and the flux collectors 16, 18, as shown in FIG. 1a, insures close coupling of the MR element 14 to the flux collectors 16, 18. The relative sensitivity of the MR element 14 increases with height, h, because as its height increases, the shape anisotropy which limits net permeability of the MR element decreases. After reaching a peak, the relative sensitivity of the MR element then begins to decrease with a continuing increase of the height, h. This occurs because the efficiency of the inter-concentrator flux coupling starts to fall off as the reluctance of the gap G between the flux collectors increases as the height of the MR element grows. For a constant 1-micron overlap at opposing edges, the height of the MR element was set at approximately 35 microns in the presently preferred embodiment. Accordingly, the gap G is 33 microns.

A plateau in sensitivity occurs as a function of the thickness, T, of the flux collectors 16, 18. For "optimized" performance per fabrication time, the overall thickness of the flux collectors 16, 18 was set at approximately six microns in the preferred embodiment.

Figure 2:
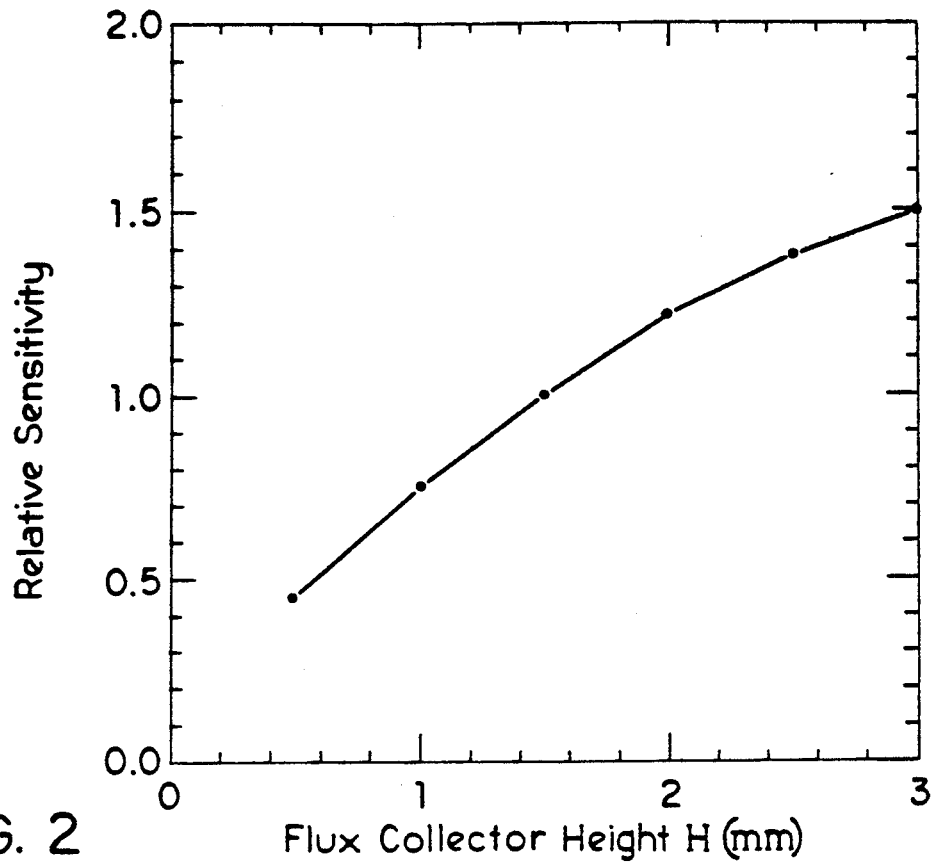

FIG. 2 shows that the sensitivity of the sensor 10 increases monotonically with the height H of the flux collectors 16, 18. With the goal of packaging the entire sensor in less than 1 cubic centimeter while maintaining adequate sensitivity, the height H of each flux collector 16, 18 was set at 1500 microns in the preferred embodiment.

The sensitivity of the field sensor 10 as a function of the height of the flux collectors 16, 18 is an outgrowth of the fact that the flux collectors 16, 18 and the MR element 14 cooperatively form an open-loop flux-conducting path of a total height of 2H+G, as shown in FIG. 1a. Because of their high permeability, relatively little magnetomotive force is developed across either one of the two flux collectors 16, 18. Thus, a total magnetomotive force across the sensor 10, due to a magnetic field along the open-loop path of height 2H+G, is developed primarily across the gap G which the MR element 14 spans. In other words, sensor sensitivity, measured by an amplified magnetomotive force developed across the gap G, is functionally related to the height of the flux collector, as shown in FIG. 2.

Figure 3:
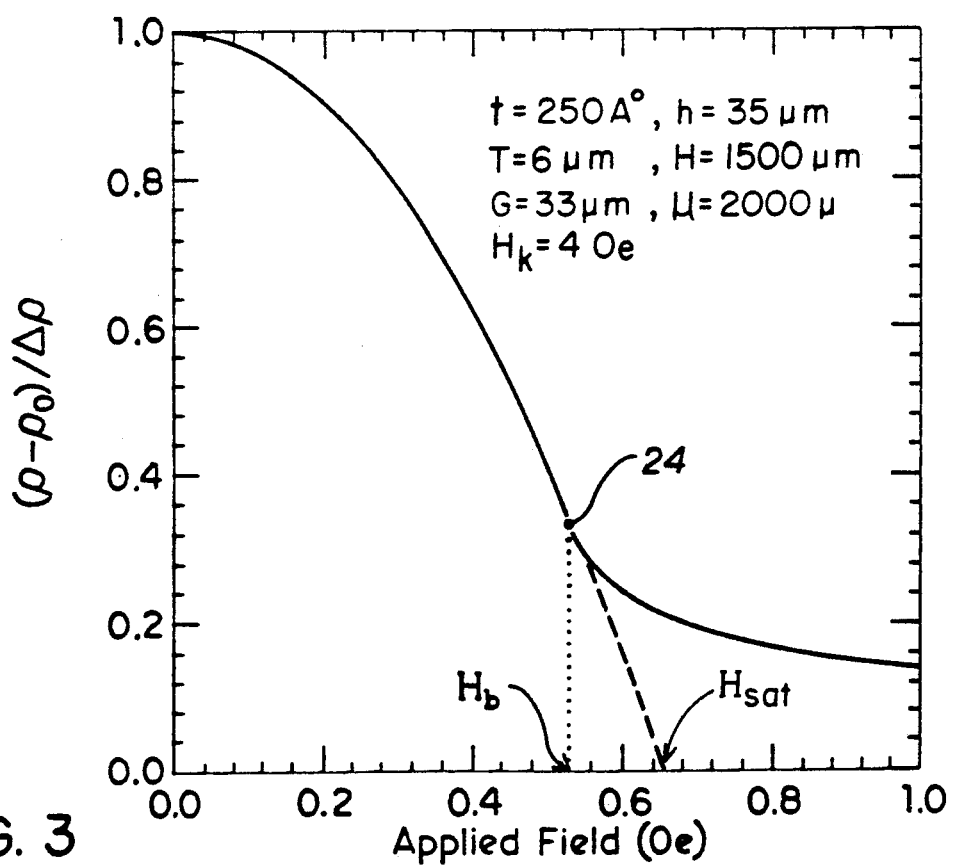
FIG. 3 is a normalized response curve showing change in resistance of a magnetoresistive element of the sensor as a function of applied magnetic field.

FIG. 3 shows the geometry-dependent magnetostatic interactions involving the MR element 14 and the flux collectors 16, 18 for the presently preferred embodiment of the invention. The sensor 10 of the present invention has about ten times the sensitivity in response to an applied magnetic field as do other single film sensors of the prior art. In particular, when operated about the normal bias point, $H_b$, i.e., the point of inflection, 24, of the curve of FIG. 3, and with a suitable amplifier, the sensor of the invention is capable of detecting low level magnetic fields of amplitude $10^{-6}$ oersted over a frequency range from d.c. to at least 1 Mhz, with a bandwidth of less than or equal to 3 Khz. Maximum signal output is obtained approximately by using an "optimal" bias field $H_b \approx 0.8 H_{SAT}$, where $H_{SAT}$ is the generalized saturation field.

Geometric values of two alternate embodiments are provided in the following Table I.

TABLE I

| $H(\mu m)$ | $T(\mu m)$ | $G(\mu m)$ | $h(\mu m)$ | $t(A°)$ | $H_{SAT}(Oe)$ |
|---|---|---|---|---|---|
| 1,500 | 6 | 30 | 35 | 250 | 0.6 |
| 10,000 | 6 | 30 | 35 | 250 | 0.2 |

Figure 4:
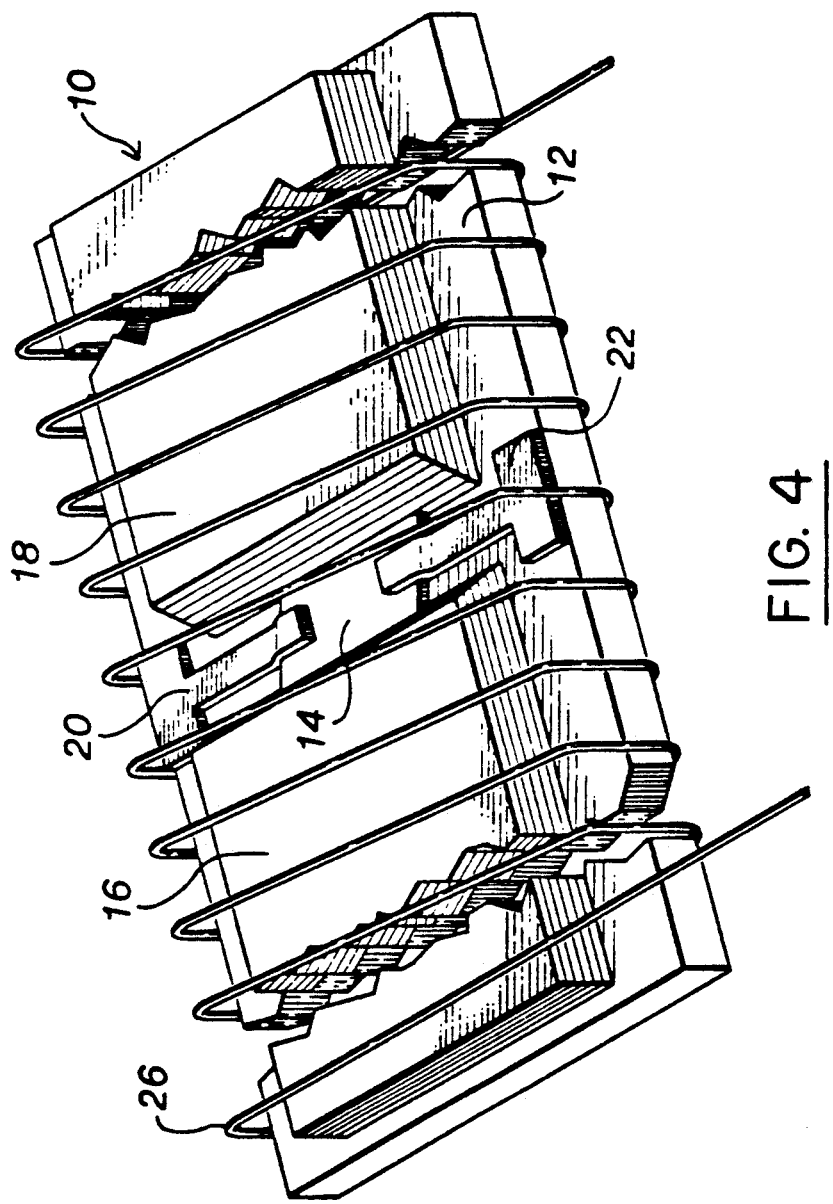
FIG. 4 is a drawing of the sensor of the invention including a compensation coil.

It will be appreciated that having a high sensitivity, the sensor 10 may readily be saturated during normal use by a field whose lines of flux are generally parallel over a given region, i.e., essentially a spatially uniform magnetic field such as the earth's magnetic field. Referring to FIG. 4, provision is made to wrap the entire sensor with a low frequency excitable compensation coil 26 to allow generating a compensation field to buck any unwanted low frequency field. The compensation field may simultaneously contain a d.c. component to provide a bias field, $H_b$, to the element 14.

The invention has been described in detail with particular reference to preferred embodiments thereof, but it will be understood that variations and modifications can be effected within the spirit and scope of the invention.

What is claimed is:

1. A sensor of the type suitable for measuring low-intensity essentially spatially uniform magnetic fields, said sensor comprising:
   a) a substrate;
   b) a magnetoresistive element deposited on said substrate;
   c) first and second electrical conductors connected, respectively, to opposing ends of said magnetoresistive element for applying a sense current therethrough; and
   d) first and second high-permeable laminated flux collectors of respective "heights" $H_1$ and $H_2$ situated with respect to said substrate to partially overlap, respectively, opposing lateral edges of said magnetoresistive element connecting said opposing ends thereof, wherein said first and said second laminated high-permeable flux collectors are separated laterally by a gap G which said magnetoresistive element spans;
   e) said first and said second high-permeable flux collectors and said magnetoresistive element cooperatively forming an pen-loop flux-conducting path of "height" $H_1°H_2+G$ capable of (1) collecting flux of a magnetic field being measured, and (2) developing a magnetomotive force, in response to the flux collected, across the gap G laterally separating said first and said second laminated flux collectors, the magnetomotive force developed increasing monotonically with the height of said flux collectors.

2. A magnetic field sensor as defined in claim 1 wherein the "heights" of said first and second laminated flux collectors are substantially equal and said first and said second flux collectors are coplanar.

3. A magnetic field sensor as defined in claim 1 wherein the sensitivity of said magnetic field sensor increases monotonically as a function of the "height" of each flux collector.

4. A magnetic field sensor as defined in claim 2 wherein the gap G separating said flux collectors is approximately 1/50 the height of one of said flux collectors.

* * * * *